United States Patent [19]
Noe

[11] Patent Number: 5,510,927
[45] Date of Patent: Apr. 23, 1996

[54] METHOD FOR SETTING THE LOCAL OSCILLATOR OF AN OPTICAL SUPERHETERODYNE RECEIVER

[75] Inventor: Reinhold Noe, Paderborn, Germany

[73] Assignee: Siemens Aktiengesellschaft, Munich, Germany

[21] Appl. No.: 308,842

[22] Filed: Sep. 19, 1994

[30] Foreign Application Priority Data

Sep. 20, 1993 [DE] Germany .......................... 43 31 882.7

[51] Int. Cl.$^6$ .................................................. H04B 10/06
[52] U.S. Cl. .............................................. 359/191; 359/192
[58] Field of Search ....................................... 359/156, 191, 359/192, 189, 190, 195

[56] References Cited

U.S. PATENT DOCUMENTS 4,868,896  9/1989  Pietzsch ..................................... 359/191
4,965,857  10/1990  Auracher et al. ......................... 359/156

OTHER PUBLICATIONS

Abbas, A Dual–Detector Optical Heterodyne Receiver for Local Oscillator Noise Suppression.
"Mark Density, Polarization Insensitive Frequency Tracking System for Optical FSK Transmission", by Takamasa Imai, et al., NTT Transmission Systems Laboratories, pp. 50–51, Proc I.O.O.C. 1989 Kobe, Japan, Paper 18, C2–6.
"ECOC 88", Fourteenth European Conference on Optical Communication Sep. 11–15, 1988, Part 1.
"Comparison of Polarization Handling Methods in Coherent Optical Systems", by Reinhold Noe, et al, Journal of Lightwave Technology, vol. 9, No. 10, Oct. 1991, pp. 1353–1366.
"Polarisation–Insensitive, 500 Mbit/s FSK Transmission Over 153 km by Passive Polarisation Switching" Electronics Letters, Jan. 5, 1989, vol. 25, No. 1, pp. 4–5.

Primary Examiner—Leo Boudreau
Assistant Examiner—Rafael Bacares
Attorney, Agent, or Firm—Hill, Steadman & Simpson

[57] ABSTRACT

Novel structure and methods for tuning the local oscillator of an optical superheterodyne receiver are disclosed. In a first method, the value of the local oscillator frequency at which the maximum of the chronological average of the output signal from the demodulator occurs is used to set the local oscillator frequency. An alternate method first and second discriminators are used to receive the intermediate frequency signal. The separate discriminator characteristics of the first and second frequency discriminators are used in setting the local oscillator frequency.

10 Claims, 5 Drawing Sheets

METHOD FOR SETTING THE LOCAL OSCILLATOR OF AN OPTICAL SUPERHETERODYNE RECEIVER

BACKGROUND OF THE INVENTION

1. Field of the Invention

The present invention relates generally to the field of optical superheterodyne receivers and, more particularly, the present invention relates to a method for setting the local oscillator of an optical superheterodyne receiver.

2. Description of the Related Art

In optical superheterodyne receivers, the strong, unmodulated light of the local oscillator is added in the receiver to the modulated light of the data signal generated in a transmission laser. This demodulation scheme provides higher sensitivity and selectivity than direct reception for selection of a specific transmission channel.

In these systems, binary Frequency Shift Keying (FSK) has proven to be an especially promising method of modulation because semiconductor transmission lasers can be frequency modulated simply by varying the current. Optimum heterodyning for this modulation requires a polarization matching of the local oscillator signal with the data signal. Data-Synchronous Polarization Keying (DSP) is of interest for this purpose in addition to polarization control and polarization diversity. (see, i.e. R. Noe et al., Electronics Letters 25 (1989) 1, 4–5 and §§IV and V by R. Noe Journal Of Lightwave Technology 9 (1991) 10. This is especially true of distributor systems having a relatively small number of transmitters and a relatively large number of subscriber receivers. DSP can be accomplished by either data-induced polarization keying with a passive birefringent component or actively by keying with a polarization modulator.

In DSP, the two characteristic frequencies are received with polarizations that are or orthogonal relative to one another. When keying is implemented at, for example, 50 transmitters and the polarization is solved for each of, for example, 10,000 receivers, the cost per subscriber becomes minimal.

Optical superheterodyne receivers require Automatic Frequency Control (AFC) of the Intermediate frequency in order to assure optimum performance. Automatic Frequency Controls have a capture range within which the rated value of the Intermediate Frequency, i.e. the correct intermediate frequency is realized after the AFC is switched on. Because the frequency uncertainty of the transmitter, or the local oscillator is generally greater than the capture range, presetting of the local oscillator frequency is required before switching the AFC. The local oscillator frequency is normally varied in a ramp form as a function of time for this purpose. The presence of the Intermediate Frequency signal and its position relative to the local oscillator frequency is determined with a level detector or frequency discriminator and the local oscillator frequency is set such that the signal is located within the capture range. The AFC is then switched on.

Various methods for automatic intermediate frequency control of DSP signals already exist. However, the only known methods for non-DSP signals require presetting the local oscillator within the capture range of the AFC (see S. Yamazaki et al., "Tunable Optical Heterodyne Receiver For Coherent FDM Broadcasting Systems", Proc. European Co. and F. on Optical Communications (ECOC 1988), Brighton, 1988, IEEE Conference Publication No. 292, Part I, Pages 86–89).

SUMMARY OF THE INVENTION

The present invention improves upon the prior art optical superheterodyne receivers and provides a technical advance by providing a method for presetting the local oscillator frequency in an optical superheterodyne receiver which is suitable for FSK-modulated optical data signals having data-synchronous polarization keying.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

Figure 1:
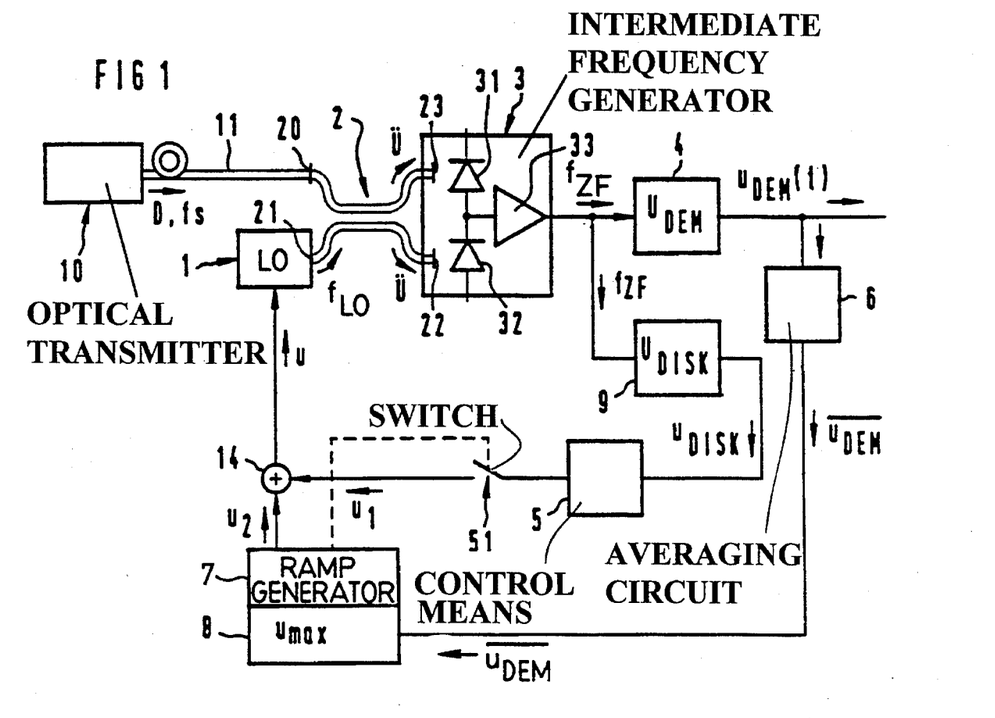
FIG. 1 illustrates a schematic block diagram of an optical superheterodyne receiver which embodies the present invention.
Figure 2:
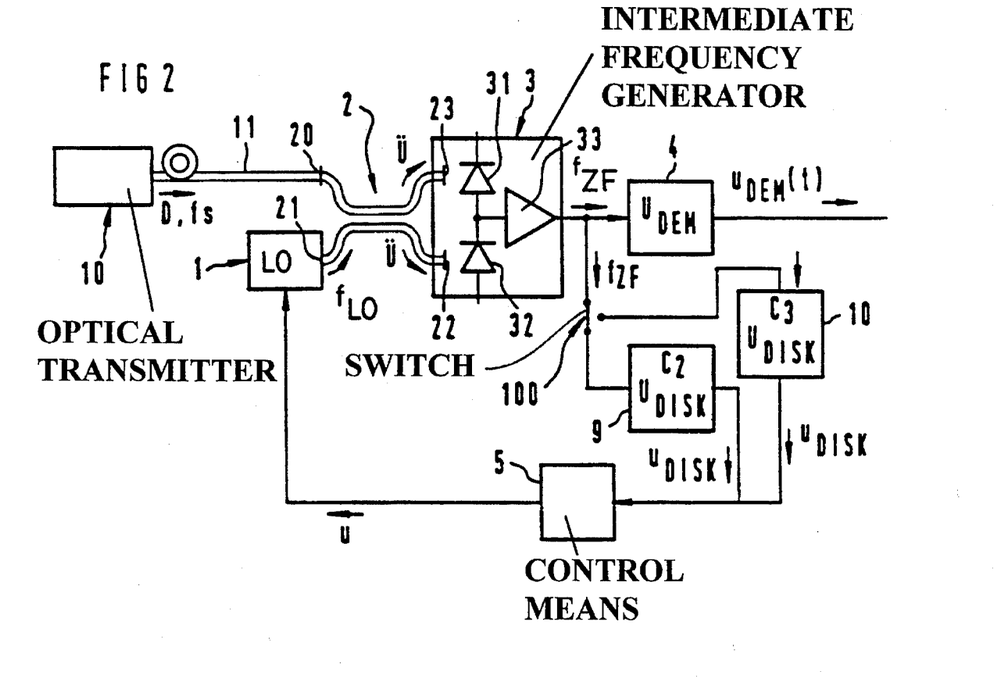
FIG. 2 illustrates a schematic block diagram of an alternate arrangement for an optical superheterodyne receiver which embodies the present invention.

FIGS. 1 and 2 illustrate two alternate embodiments of an optical superheterodyne receiver for FSK-modulated binary data signals D. Each of the receivers respectively comprise a local oscillator 1, an optical coupler 2, an intermediate frequency generator 3, and a control means 5 for automatically regulating the intermediate frequency $f_{ZF}$ to a rated or desired value. In these receivers, the local oscillator 1 generates a specific local oscillator signal $f_{LO}$ that can be adjusted by a control signal u supplied to the local oscillator 1. The optical data signal D is generated by an optical transmitter 10 and is conducted to an input 20 of the optical coupler 2 through a section of optical fiber 11. The local oscillator signal $f_{LO}$ is supplied to a different input 21 of the optical coupler 2. Data-induced polarization keying may be selected in the transmitter 10 for the data signal D. This signal is transmitted through a polarization preserving section of optical fiber 11 whereby the polarization of the transmitter 10 is linear and its phase is at 45° relative to the principle axes at the input of the optical fiber 11.

The data signal D and the local oscillator signal $f_{LO}$ are superimposed on one another in the optical coupler 2 and generate an optical superposition signal U. The intermediate frequency signal generator 3 generates the intermediate frequency signal $f_{ZF}$ by detecting the superposition signal U in one of two photo-detectors 31 or 32. The intermediate frequency signal generator 3 is arranged opposite the outputs 23 and 22 of the optical coupler 2. The intermediate frequency signal $f_{ZF}$ is then amplified in an electrical amplifier 33.

The section of optical fiber 11 may alternately be located in the receiver (see, i.e. §§IV and V of R. Noe, Journal Of Lightwave Technology, 9 (1991) 10). In another alternate embodiment, an active polarization modulator may be employed at the transmitter 10 in place of the optical fiber 11.

In optical heterodyne reception, the intermediate frequency $f_{ZF}$ is the difference between the transmission frequency $f_s$ of the data signal D and the local oscillator frequency $f_{LO}$, i.e.

$$f_{ZF} = f_s - f_{LO}$$

Further processing of the intermediate frequency signal $f_{ZF}$ generally occurs and the amplified intermediate frequency signal $f_{ZF}$ is supplied to a demodulator such as a frequency discriminator. The output signal of the demodulator is low-pass filtered in order to eliminate noise. The low-pass filtered signal is supplied to a discriminator and a clock recovery circuit. The discriminator and the clock recovery circuit have not been shown in FIGS. 1 and 2 for the sake of clarity.

In the exemplary embodiment of FIG. 1, the choice of the demodulator 4 in the receiver is critical. The demodulator 4 for demodulating the intermediate frequency signal $f_{ZF}$ has a defined static demodulator characteristic $C_1$ as set forth in FIG. 3a which represents the time-independent output signal $U_{DEM}$ of the demodulator 4 as a specific function of the intermediate frequency $f_{ZF}$. The demodulator characteristic $C_1$ is selected such that it comprises a positive maximum $C_{11}$ at a rated or desired value of one of the two characteristic frequencies $f_1$, $f_2$ which represent the two binary symbols of the binary data signal D and has a negative minimum $C_{12}$ at a rated value of the other characteristic frequency. This is necessary for optimum receiver sensitivity. Additionally, the demodulator characteristic $C_1$ is selected such that it has a zero-axis crossing at a rated value of the average $(f_1 + f_2)/2$ of the characteristic frequencies $f_1$, $f_2$ such that it is located in the middle between the two characteristic frequencies $f_1$, $f_2$. In order to process an optimally high frequency shift at a given intermediate frequency $f_{ZF}$ and in order to be able to transmit at an optimally high data rate it is desirable to select an approximately sine-shaped demodulator characteristic. This result is approximately achieved by a discriminator characteristic having the relationship: $f_2 = 3 \cdot f_1$.

Figure 3A:
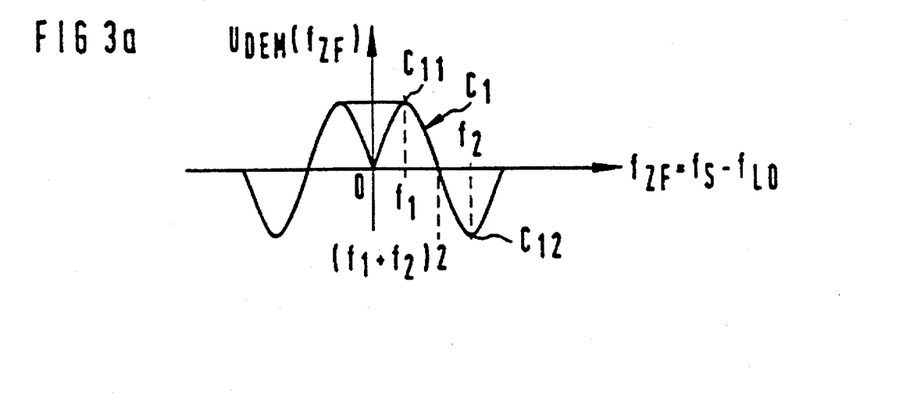
FIG. 3a illustrates a demodulator characteristic as a function of the intermediate frequency.

The demodulator characteristic $C_1$ illustrated in FIG. 3a satisfies these conditions. In FIG. 3A, the characteristic $C_1$ exhibits a positive maximum $C_{11}$ at the characteristic frequency $f_1$ which is lower than the frequency $f_2$ of the negative minimum $C_2$. The rated values of these characteristic frequencies are intended to be precise.

Figure 3B:
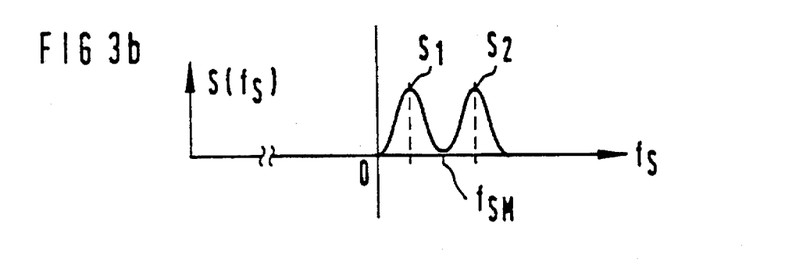
FIG. 3b illustrates a frequency spectrum of an FSK-modulated optical data signal without polarization keying.
Figure 3C:
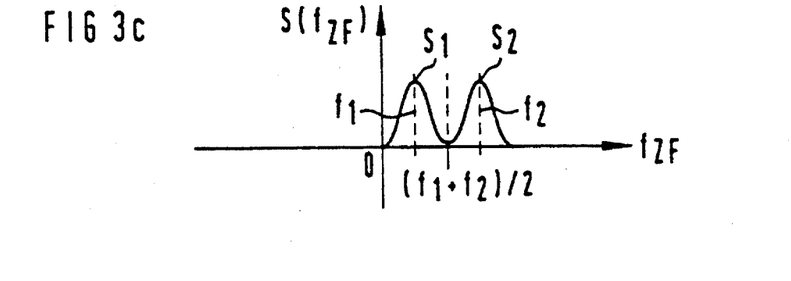
FIG. 3c illustrates the frequency spectrum of FIG. 3B in the intermediate frequency range.
Figure 3D:
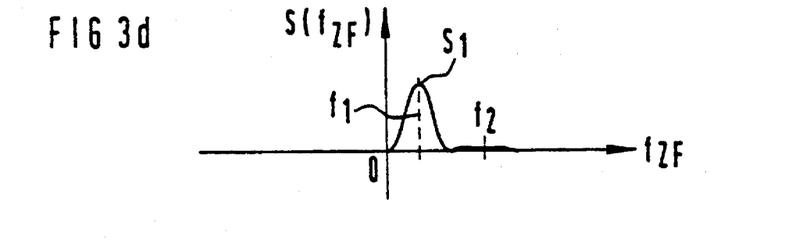
FIG. 3d illustrates a frequency spectrum of an FSK-modulated data signal with data synchronous polarization keying in the intermediate frequency range.
Figure 3E:
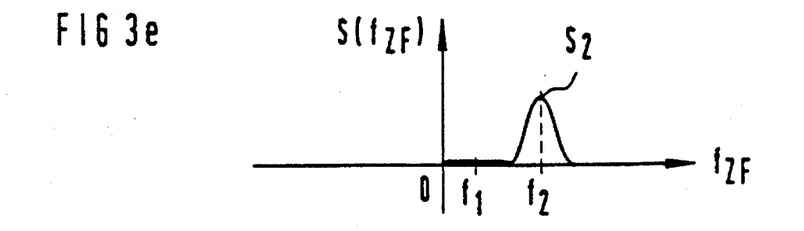
FIG. 3e illustrates another frequency spectrum of the FSK-modulated data signal with data-synchronous polarization keying.
Figure 3F:
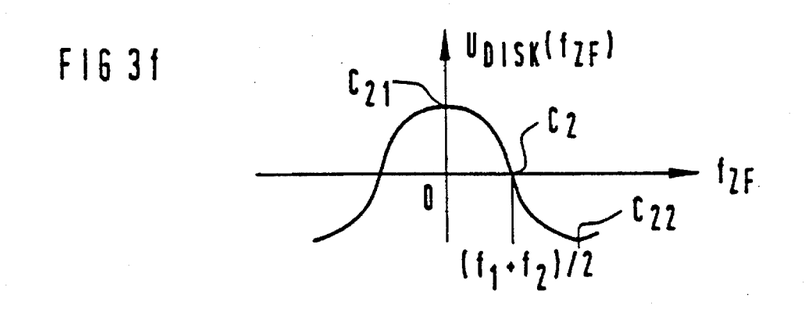
FIG. 3f illustrates a discriminator characteristic of a frequency discriminator as a function of the intermediate frequency.

The demodulator 4 could also employ the characteristic $C_2$ illustrated in FIG. 3f. For simplicity, it may be assumed that the intermediate frequency $f_{ZF}$ is a function which is symmetrical about the zero crossing of the intermediate frequency $f_{ZF}$. This is due to the fact that the demodulator 4, which may be a frequency discriminator, operates independently of whether the intermediate frequency $f_{ZF}$ is "positive" or "negative".

The chronologically dependent output signal $u_{DEM}$ (t) of the demodulator 4 in the preferred exemplary embodiment is equal at every point in time t to the value derived from the chronologically independent output signal $U_{DEM}$ ($f_{ZF}$) of the demodulator 4. The value of the chronologically dependent intermediate frequency $f_{ZF}$ (t), is therefore:

$$u_{DEM}(t) = U_{DEM}(f_{ZF}(t))$$

The chronological average $\overline{u_{DEM}}$ of the chronologically dependent output signal $u_{DEM}$ is the result of averaging over all frequencies supplied to the demodulator 4. Resulting in the following equation:

$$\overline{u_{DEM}} = \int U_{DEM}(f_{ZF}) \cdot S(f_{ZF}) \cdot df_{ZF} / \int S(f_{ZF}) \cdot df$$

where S ($f_{ZF}$) is the spectrum of the data signal D in the intermediate frequency range modulated by the average $(f_1 + f_2)/2$ of the characteristic frequencies. The characteristic $C_1$ is such that the time-dependent output signal $U_{DEM}$ of the demodulator 4 is not only dependent on the intermediate frequency $f_{ZF}$ but is also proportional to the amplitude of the signal supplied to the demodulator 4 so the norming signal in the denominator may be replaced a proportionality constant k resulting in the following equation:

$$\overline{u_{DEM}} = \int U_{DEM}(f_{ZF}) \cdot S(f_{ZF}) \cdot df_{ZF} / k$$

In reality, actual results lie somewhere between equation having the norming integral in the denominator and the equation having the proportionality constant k in the denominator. The relationship set forth in these two equations is also valid for other frequency discriminators, envelope detectors, level-measuring means, etc. each having a corresponding different function $U(f_{ZF})$.

FSK-modulated binary data signals D comprise an intermediate frequency spectrum S ($f_s$) such as that set forth in FIG. 3b which is symmetric about the center frequency $f_{SM}$ having a maximum $S_1$ at the left of the center frequency f and having a maximum $S_2$ located higher or to the right of the center frequency $f_{SM}$. The corresponding intermediate frequency spectrum $S(f_{ZF})$ in the intermediate frequency range $f_{ZF}$ is shown in FIG. 3c.

In contrast, for FSK-modulated data signals D having data-synchronous polarization keying, the intermediate frequency spectrum $S(f_{ZF})$ can be asymmetrical depending on the polarization of the data signal D received by the receiver and on the polarization of the local oscillator signal $f_{LO}$. FIGS. 3d and 3e respectively illustrate the extreme cases where only one maximum $S_1$ or $S_2$ is present. It should be noted that the optical power spectrum always remain symmetrical, however, the polarization-weighted intermediate frequency spectrum ($S(f_{ZF})$) may be asymmetrical.

In the exemplary embodiment of FIG. 1, it is critical that the chronological average $\overline{u}_{DEM}$ of the chronologically dependent output signal $u_{DEM}$ of the demodulator 4 correspond with the intermediate frequency $f_{ZF}$. An averaging circuit 6 for forming the chronological average $\overline{u}_{DEM}$ of the chronologically dependent output signal $u_{DEM}$ of the demodulator 4 is therefore provided in this exemplary embodiment. The chronological average $u_{DEM}$ of the chronologically dependent output signal $u_{DEM}$ of the demodulator 4 with the assumed demodulator characteristic $C_1$ as illustrated in FIG. 3a for the symmetrical intermediate frequency spectra $S(f_{ZF})$ as illustrated in FIG. 3c behaves as a function of the intermediate frequency $f_{ZF}$ as shown in FIG. 3h. Accordingly, this average $u_{DEM}$ exhibits a positive maximum $u_{max}$ at $f_{ZF} = f_{SM} - f_{LO} = 0$.

Figure 3G:
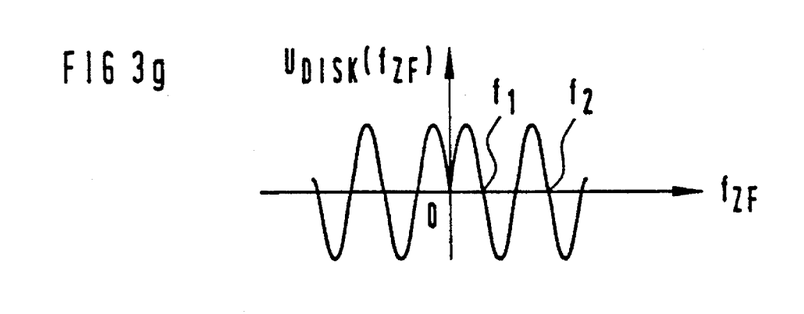
FIG. 3g illustrates another discriminator characteristic of a frequency discriminator as a function of the intermediate frequency.
Figure 3H:
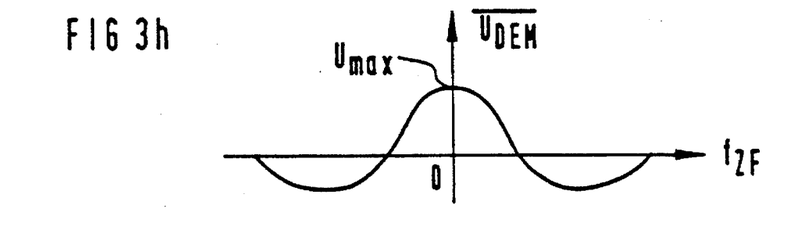
FIG. 3h illustrates a chronological average formed from the output signal of a demodulator having the demodulator characteristic of FIG. 3 as a function of the intermediate frequency.
Figures 3I, 3J:
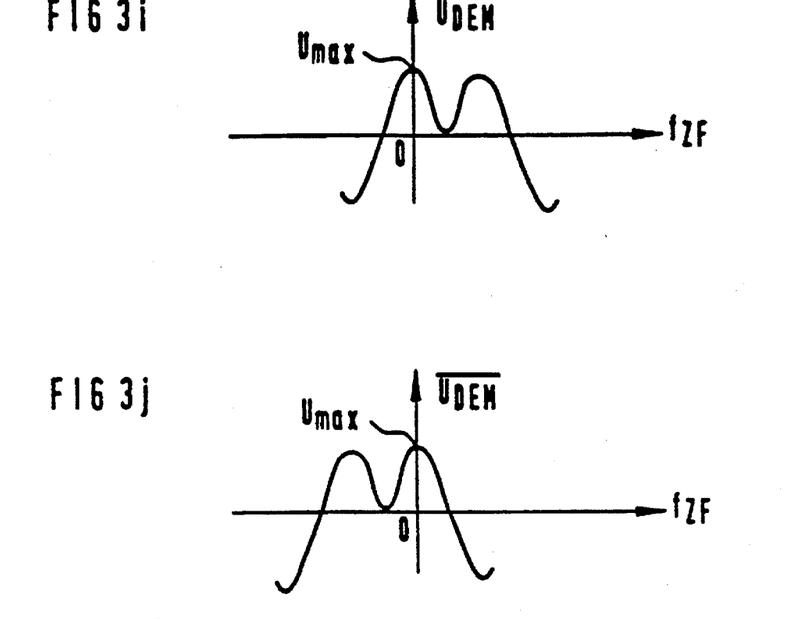
FIG. 3i illustrates the chronological average of the assymmetrical frequency spectrum of FIG. 3e.
FIG. 3j illustrates the chronological average of the asymmetrical frequency spectrum of FIG. 3f.

The chronological average $\overline{u}_{DEM}$ of the chronologically dependent output signal $u_{DEM}$ of the demodulator 4 having the assumed demodulator characteristic $C_1$ as illustrated in FIG. 3a for the asymmetrical intermediate frequency spectra $S(f_{ZF})$ according to FIG. 3d behaves as a function of the intermediate frequency as illustrated in FIG. 3i. Accordingly, this average $\overline{u}_{DEM}$ exhibits a positive maximum $u_{max}$ at $f_{ZF} = f_{SM} - f_{LO} = 0$ and exhibits a smaller, second positive maximum to the right of the identified positive maximum. It behaves for asymmetrical intermediate frequency spectra $S(f_{ZF})$ according to FIG. 3e as a function of the intermediate frequency $f_{ZF}$ as shown in FIG. 3j. Accordingly, this average $\overline{u}_{DEM}$ also exhibits a positive maximum $u_{max}$ at $f_{ZF} = f_{SM} - f_{LO} = 0$ and exhibits a smaller, second positive maximum to the left thereof. The curves set forth in FIGS. 3i and 3j are mirror inverted relative to one another.

It may be observed from the illustrations of FIGS. 3h, 3i and 3j that it is sufficient to note the setting of the local oscillator frequency $f_{LO}$ at which the positive maximum umax of the average $u_{DEM}$ appears in the intermediate frequency signal search. Because this maximum occurs at $f_{ZF} = f_{SM} - f_{LO} = 0$, there is a basis for setting the local oscillator 1 independently of the polarization or, respectively, the form of the spectrum. The local oscillator frequency $f_{LO}$ is then set such that $f_{ZF} = (f_1 f_2)/2$ or, respectively, $f_{LO} = f_{SM} - (f_1 + f_2)/2$ is valid. This setting of the local oscillator frequency is advantageously suited for both FSK-modulated data signals with and without data synchronous polarization keying.

Implementation of a first method for practicing the present invention will be described with reference to FIG. 1. The exemplary receiver of FIG. 1 preferably comprises a means for recognizing the maximum $u_{max}$ of the chronological average $\overline{u}_{DEM}$ 8 located at the intermediate frequency value zero, after which the local oscillator frequency $f_{LO}$ associated with this intermediate frequency value zero is retained and can be set by the ramp signal $u_2$ such that the intermediate frequency $f_{ZF}$ is approximately equal to a rated value average $(f_1 + f_2)/2$ for the two characteristic frequencies $f_1$, $f_2$.

The ramp signal $u_2$ is generated by a ramp signal generator 7 and is supplied to the local oscillator 1 by superposition means 14, such as an adder, with which the output signal $u_1$ of the control means 5 can be superimposed on the ramp signal $u_2$. The superimposed signals $u_1$ and $u_2$ are fed to the local oscillator 1 as a control signal u.

In conventional optical superheterodyne receivers having automatic intermediate frequency control, the control means 5 is preceded by a frequency discriminator 9 having a defined static discriminator characteristic $C_2$ that represents a time-independent output signal $U_{DISK}$ defining a chronologically dependent output signal $U_{DISK}$ of the discriminator 9 as a function of the intermediate frequency $f_{ZF}$. The intermediate frequency signal $f_{ZF}$ is supplied to the frequency discriminator 9 and the chronologically dependent output signal $U_{DISK}$ is connected to the control means as an actual value.

A discriminator characteristic $C_2$ such as that illustrated in FIG. 3f is chosen for the frequency discriminator 9 in many heterodyne receivers. The control means 5 amplifies the deviations from the rated value of the chronologically dependent output signal $U_{DISK}$ of the frequency discriminator 9 and sends them with a suitable polarity sign to the frequency modulation input or control input of local oscillator 1 as control a signal $u_1$. The local oscillator frequency $f_{LO}$ is then retuned such that the center frequency $f_{SM}$ is located at the zero axis crossing of the characteristic $C_2$ of FIG. 3f or of the average $(f_1 + f_2)/2$ as illustrated in FIG. 3c. In one exemplary embodiment, a PI regulator is employed as the control means 5.

With symmetrical intermediate frequency spectra $S(f_{ZF})$ as illustrated in FIG. 3c, the characteristic illustrated in FIG. 3f may also be employed for presetting the local oscillator frequency $f_{LO}$. In order to accomplish this result, the feed of the output signal $u_1$ from control means 5 to the local oscillator 1 is interrupted by a switch 51 and the local oscillator frequency $f_{LO}$ is tuned so that it lies approximately at the suspected center frequency $f_{SM}$. A positive maximum for the chronologically dependent output signal $U_{DISK}$ of the discriminator 9 results for $f_{LO} = f_{SM}$. The setting can now be varied such that $f_{LO} = f_{SM} - (f_1 + f_2)/2$ is true (see FIG. 3c). The output signal $u_1$ of the control means 5 is again supplied to the local oscillator 1 as a control signal such as, for example, by closing the switch 51. This tuning method is described in S. Yamazaki et al., "Tunable Optical Heterodyne Receiver For Coherent FDM Broadcasting System" Proc. European Co and F. on Opt. Commun. (ECOC 1988), Brighton, 1988, IEEE Conference Publication No. 292, Part 1, pages 86–89.

With an oppositely selected operational sign for the gain of the control circuit, a zero point of the discriminator characteristic having a zero axis crossing direction from the positive to the negative is not realized. In this situation, a zero axis crossing direction having the crossing direction from the negative to the positive side is achieved. When the presetting of the local oscillator frequency $f_{LO}$ moves away from the point $f_{LO} = f_{SM}$ to the point $f_{LO} = f_{SM} + (f_1 f_2)/2$, the heterodyne signal is received in inverted position instead of being received in standard position as shown in FIG. 3.

Figure 3K:
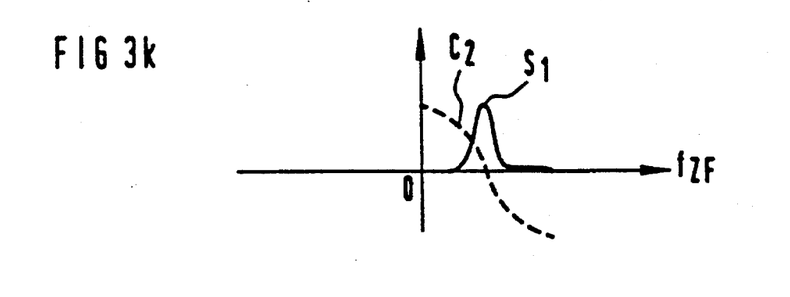
FIG. 3k illustrates the frequency spectrum of FIG. 3d or 3e shifted by the discriminator characteristic of FIG. 3f toward the zero axis crossing.

With an asymmetrical intermediate frequency spectra $S(f_{ZF})$ as set forth in FIGS. 3d or 3e, a characteristic $C_2$ according to FIG. 3f results in less than optimum receiver sensitivity because the AFC will "pull" the maximum $S_1$ or $S_2$ corresponding to one of the two characteristic frequencies $f_1$ or $f_2$ respectively into the range of the zero axis crossing of the characteristic $C_2$ of FIG. 3f as indicated for example in FIG. 3k with the spectrum $S(f_{ZF})$ according to FIG. 3d. In such a situation, a frequency discriminator having discriminator characteristic $C_3$ according to FIG. 3d is therefore employed as set forth by R. Noe et al., Electronics Letters 25, 1, 4–5 and 3 (1989). An alternate solution is set forth in T. Imai, K. Iwashita, Proc. IOOC 1989 Kobe, Japan, Paper 18 C2–6.

With the discriminator characteristic $C_3$ as set forth in FIG. 3g having two zero-axis crossings of the same polarity, i.e. having the same crossing direction across the x-axis, the characteristic $C_3$ is situated at the two rated or desired values of the two characteristic frequencies $f_1$, $f_2$ of the demodulator characteristic $C_1$ extremes in FIG. 3a. Each maximum $S_1$ and $S_2$ of the intermediate frequency spectra $S(f_{ZF})$ according to FIGS. 3c, 3d and 3e is "pulled" to the zero-axis crossing lying at the rated value of the characteristic frequency $f_l$ or $f_2$ allocated to the respective maximum $S_1$ or $S_2$, independently of the presence of other maximum. Unfortunately, a discriminator having the discriminator characteristic $C_3$ as set forth in FIG. 3g is either not suitable or it is poorly suited for presetting the local oscillator frequency $f_{LO}$.

An alternate method for practicing the invention eliminates this problem and is set forth by in greater detail by way of the following example illustrated with reference to FIG. 2. Initially, superposition signal $\ddot{U}$ is generated with a frequency discriminator 9 having a frequency characteristic $C_2$ as set forth in FIG. 3f. Alternatively, the superposition signal $\ddot{U}$ may also be generated with a frequency discriminator having a frequency characteristic $C_3$ as set forth in FIG. 3g. As a result of possible asymmetry of the frequency spectrum $S(f_{ZF})$ of the data signal (D), information about the position of the frequency spectrum $S(f_{ZF})$ that can be obtained with such a discriminator is not precise enough to set the local oscillator frequency $f_{LO}$ such that the superposition signal will definitely lie within the capture range of the discriminator having the characteristic $C_3$ illustrated in FIG. 3g. For this reason, the superposition signal $\ddot{U}$ is first pre-engaged with the AFC by the discriminator 9. having the characteristic $C_2$ as set forth in FIG. 3f. As previously mentioned, the maximum $S_1$ or, $S_2$ of the spectrum $S(f_{ZF})$ having an asymmetrical intermediate frequency spectrum $S(f_{ZF})$ is pulled into the proximity of the zero-axis crossing of this discriminator with characteristic $C_2$ as indicated, for example, in FIG. 3k. The asymmetrical frequency spectrum $S(f_{ZF})$ will now definitely be located within the capture range of the discriminator 9.

The AFC is now switched from the discriminator 9 for example with a switch 100 to a discriminator 10 having a frequency characteristic $C_3$ as set forth in FIG. 3g. This causes the maximum $S_1$ or $S_2$ of the asymmetrical intermediate frequency spectrum $S(f_{ZF})$ to be pulled to the zero-axis crossing that lies at the rated value of the respective characteristic frequency $f_l$ or $f_2$ which is associated with the respective maximum $S_1$ or $S_2$, respectively. The zero-axis crossing of the characteristic $C_2$ set forth in FIG. 3f should lie at exactly the same zero-axis crossing of the characteristic $C_3$ set forth in FIG. 3g which is at the rated value average $(f_1 + f_2)/2$ of the characteristic frequencies $f_1, f_2$. If these two zero-axis crossings do not lie at exactly the same frequency, it is possible that the discriminator 10 of FIG. 3g is not "pulling" the signal to the correct location because the capture range has been exceeded. This follows from the pre-engagement illustrated in FIG. 3k, where the maximum $S_1$ of the intermediate frequency spectrum $S(f_{ZF})$, for example, would not be pulled in case of error to the allocated zero-axis crossing at the rated value of the characteristic frequency $f_1$ but rather to the rated value of the characteristic frequency $f_2$.

Figure 3L:
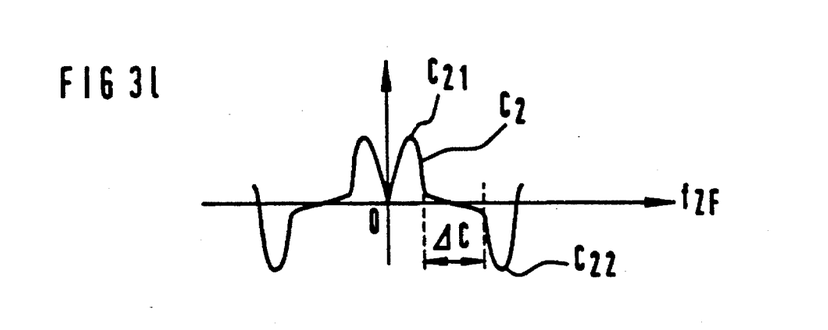
FIG. 3l illustrates a discriminator characteristic as a function of the intermediate frequency.

In order to avoid this result, it is desirable not to use the frequency discriminator 9 having the characteristic $C_2$ as set forth in FIG. 3f but rather to employ a discriminator 9 having characteristic $C_2$ as set forth in FIG. 3l that comprises a range $\Delta C$ containing the zero-axis crossing and lying between its maximum $C_{21}$ and minimum $C_{22}$. The characteristic $C_2$ being essentially flat in the $\Delta C$ range so that the time-independent output signal $U_{DISK}$ of this discriminator has values in this range that lie closer to zero in terms of the ordinate than their maximum $C_2$ and minimum $C_2$. The characteristic $C_2$ as set forth in FIG. 3l can be achieved by a linear combination of the time-independent output signals of two discriminators, such as, for example, having $U_{DISK}$ according to FIG. 3f $-0.5 \cdot U_{DEM}$ as set forth in FIG. 3g or having $U_{DEM}$ as set forth in FIG. 3a $+0.5 \cdot U_{DISK}$ according to FIG. 3g. It will be understood that the numerical values are approximate and corresponding discriminators are to be provided in the receiver.

Three alternative choices for the frequency discriminator for use in the optical superheterodyne receiver of the present invention are set forth below. One discriminator is set forth in FIG. 4b which comprises a power divider 90 that receives the intermediate frequency signal $f_{ZF}$ and which divides the intermediate frequency $f_{ZF}$ into two equal power signals. A multiplier 91 has a first input 911 into which one of the two signals is directly supplied and a second input 912 to which the other signal is supplied through a delay element 910 which delays the signal by a defined time $\tau$. An output 913 provides the output signal that is formed by the multiplier 91 and contains a sum frequency and a difference frequency of the two signals. That portion of the signal containing the sum frequency is filtered out. For this discriminator, the equation, $U_{DISK} = \cos(\omega \cdot \tau)$ applies where $\omega$ is the frequency in radians. The characteristic of this discriminator is shown on the right next to the discriminator illustrated in FIG. 4b.

Figure 4A:
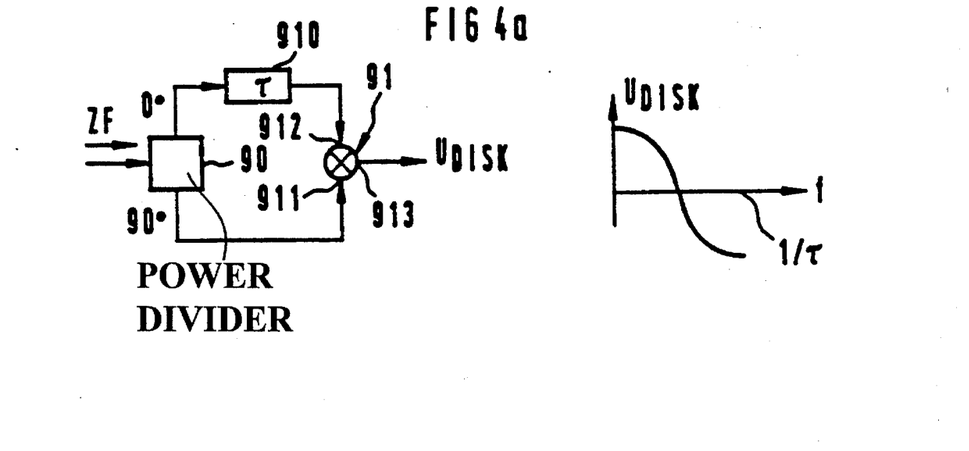
FIG. 4a illustrates a first exemplary embodiment of a frequency discriminator for use with the present invention.
Figure 4B:
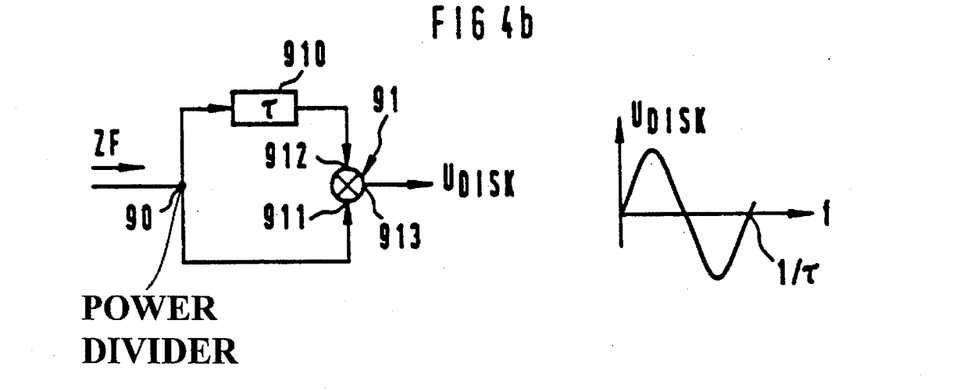
FIG. 4b illustrates a second exemplary embodiment of frequency discriminator for use with the present invention.

The discriminator set forth in FIG. 4a differs from the discriminator of FIG. 4b only in that the power divider is a 90° hybrid which also divides the intermediate frequency signal $f_{ZF}$ into two equal power signals that are phase-shifted by 90° relative to each other. The equation $U_{DISK} = \sin(\omega \cdot \tau)$ applies for this discriminator as set forth in FIG. 4a. Its characteristic is also shown to the right of this discriminator.

Figure 4C:
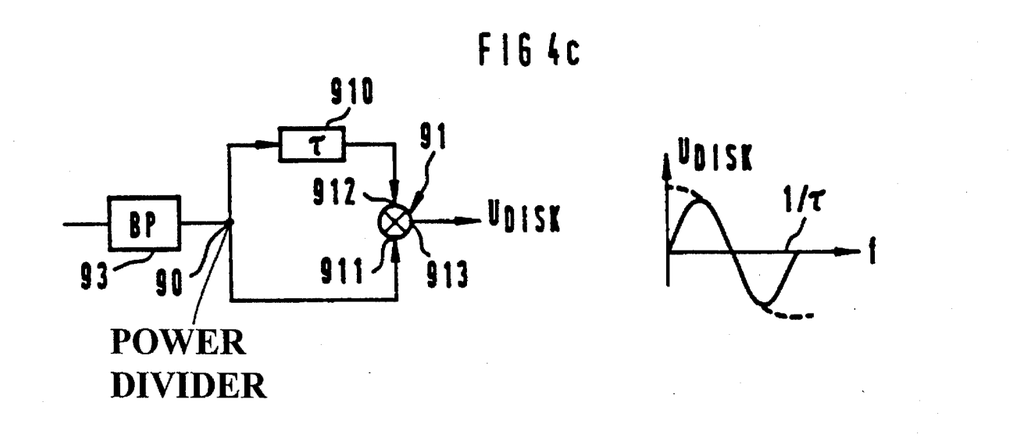
FIG. 4c illustrates another exemplary embodiment of a frequency discriminator for use with the present invention.

The discriminator set forth in FIG. 4c differs from the discriminator of 4b in that a bandpass filter 93 which separates high and low frequencies is connected to the power divider 90. The equation $U_{DISK} = \sin(\omega \cdot \tau)$ applies for this discriminator. The characteristic of the discriminator is shown to the right of the discriminator and the broken line corresponds to the characteristic of this discriminator without the bandpass filter 93.

With the discriminators set forth in FIGS. 4a–4c, $|\omega|$ can be just as easily employed instead of $\omega$ since the electrical circuits do not distinguish between "positive" and "negative" frequencies. The characteristics of these discriminators are therefore only shown for positive frequencies. Other realizations of frequency discriminators can also be employed for the receivers of the invention.

The present invention is subject to many variations modifications and changes in detail. It is intended that all matter described throughout the specification an shown in the accompanying drawings be considered illustrative only. Accordingly, it is intended that the invention be limited only by the spirit scope of the appended claims.

I claim:

1. A method for setting the local oscillator of an optical superheterodyne receiver, the receiver comprising an optical local oscillator for generating a local oscillator signal having a frequency, an optical coupler for superimposing a data signal and the local oscillator signal to generate an optical superimposed signal containing an intermediate frequency signal, a control means for adjusting the frequency of the local oscillator signal, and a demodulator for demodulating the intermediate frequency signal wherein the demodulator has a static demodulation characteristic which exhibits a positive value at a first characteristic frequency of the data signal and a negative value at a second characteristic frequency and wherein a time-independent output signal monotonically decreases from the positive value to the negative value with a zero-axis crossing midway between the first characteristic frequency and the second characteristic frequency, said method comprising the steps of:

1) providing a chronological average of an output signal from the demodulator;
2) identifying the value of the local oscillator frequency at which the maximum of the chronological average of the output signal from the demodulator occurs;
3) setting the local oscillator frequency to a value equal to the identified value of the local oscillator frequency minus the average of the first and second characteristic frequencies; and
4) activating automatic control of the control means for adjusting the frequency of the local oscillator signal.

2. The method for setting the local oscillator of an optical superheterodyne receiver of claim 1, wherein the demodulation characteristic positive value is a maximum and the negative value is a minimum.

3. A method for setting the local oscillator of an optical superheterodyne receiver, the receiver comprising an optical local oscillator for generating a local oscillator signal having a frequency, an optical coupler for superimposing a data signal and the local oscillator signal to generate an optical superposition signal with an intermediate frequency signal, a control means for adjusting the frequency of the local oscillator signal with an input connected to the outputs of first and second frequency discriminators which alternately receive the intermediate frequency signal as an input through a switch, said method comprising the steps of:

1) pre-engaging the intermediate frequency signal with the first frequency discriminator having a discriminator characteristic which is a monotonic function of the intermediate frequency and which comprises a zero-axis crossing at a rated value of the average of first and second characteristic frequencies of the data signal; and
2) switching the intermediate frequency to the second frequency discriminator, said second discriminator having a discriminator characteristic that exhibits a first zero-axis crossing at a rated value of the average of the first and second characteristic frequencies, a second zero-axis crossing at the rated value of the first characteristic frequency and a third zero-axis crossing at the rated value of the second characteristic frequency wherein the zero-axis crossings at each of the characteristic frequencies cross the x-axis in the same direction.

4. The method for setting the local oscillator of an optical superheterodyne receiver of claim 3, wherein the discriminator characteristic of the first discriminator further comprises a positive maximum at a value of the intermediate frequency which is lower than the rated value of the first and second characteristic frequencies and a negative minimum at a value of the intermediate frequency which is higher than the rated value of the first and second characteristic frequencies.

5. The method for setting the local oscillator of an optical superheterodyne receiver of claim 3, wherein the discriminator characteristic of the first discriminator further comprises a frequency range between the maximum and minimum which contains the zero-axis crossing of the discriminator characteristic and within which the characteristic is essentially flat.

6. An optical superheterodyne receiver comprising;

an optical local oscillator for generating a local oscillator signal having a frequency which may be adjusted by a control signal;

an optical coupler for superimposing a data signal and the local oscillator signal to generate an optical superimposed signal;

a means for acquiring an intermediate frequency signal from the optical superimposed signal;

a demodulator for demodulating the intermediate frequency signal having a demodulator characteristic representing a time-independent output of the demodulator as a function of the intermediate frequency which exhibits a positive value at a first characteristic frequency of the data signal and a negative value at a second characteristic frequency of the data signal and wherein there is a monotonic drop from the positive value to the negative value with a zero-axis crossing midway between the first and second characteristic frequencies;

a control means for controlling a frequency of the intermediate frequency signal by adjusting the frequency of the local oscillator with a control signal;

a means for generating a chronological average of an output from the demodulator; and a means for determining the maximum of the chronological average and the corresponding value of local oscillator frequency at which this maximum occurs.

7. An optical superheterodyne receiver comprising;

an optical local oscillator for generating a local oscillator signal having a frequency which may be adjusted by a control signal;

an optical coupler for superimposing a data signal and the local oscillator signal to generate an optical superimposed signal;

a means for acquiring an intermediate frequency signal from the optical superimposed signal;

a control means for providing the control signal for adjusting the frequency of the local oscillator signal, said control means having an input connected to the outputs of first and second frequency discriminators;

a switch means having an input connected to the intermediate frequency signal for alternately connecting the intermediate frequency signal to the first and second discriminators;

wherein the first frequency discriminator has a discriminator characteristic which is a monotonic function of the intermediate frequency and which comprises a zero-axis crossing at a rated value of the average of first and second characteristic frequencies of the data signal; and wherein the second frequency discriminator has a discriminator characteristic that exhibits a first zero-axis crossing at a rated value of the average of the first and second characteristic frequencies, a second zero-axis crossing at the rated value of the first characteristic frequency and a third zero-axis crossing at the rated value of the second characteristic frequency wherein the zero-axis crossings at each of the characteristic frequencies cross the x-axis in the same direction.

8. The optical superheterodyne receiver of claim 7, wherein the first frequency discriminator employs a power divider for dividing the intermediate frequency signal into two half-power signals.

9. The optical superheterodyne receiver of claim 8 wherein the power divider is a 90 hybrid.

10. The optical superheterodyne receiver of claim 8, further comprising a band-pass filter associated with the input of the power divider.

* * * * *